United States Patent [19]

Hutchison et al.

[11] 4,290,019
[45] Sep. 15, 1981

[54] METHODS OF DERIVING IMAGE INFORMATION FROM OBJECTS

[75] Inventors: James M. S. Hutchison; John R. Mallard; Robert J. Sutherland, all of Aberdeen, Scotland

[73] Assignee: National Research Development Corporation, London, England

[21] Appl. No.: 10,913

[22] Filed: Feb. 9, 1979

[30] Foreign Application Priority Data

May 31, 1978 [GB] United Kingdom ............... 25899/78

[51] Int. Cl.$^3$ ............................................ G01N 27/00
[52] U.S. Cl. ..................................... 324/311; 324/309
[58] Field of Search ............................... 324/309, 311

[56] References Cited

U.S. PATENT DOCUMENTS

| 3,932,805 | 1/1976 | Abe | 324/309 |
| 4,021,726 | 5/1977 | Garroway | 324/309 |
| 4,045,723 | 8/1977 | Ernst | 324/309 |
| 4,115,730 | 9/1978 | Mansfield | 324/309 |

Primary Examiner—Michael J. Tokar
Attorney, Agent, or Firm—Cushman, Darby and Cushman

[57] ABSTRACT

A method of deriving image formation from an object using nuclear magnetic resonance signals comprises the steps of subjecting an object to a static magnetic field along one axis, applying a first gradient to said magnetic field which varies in a direction orthogonal to said axis together with a 90° high frequency pulse, reversing the direction of said magnetic field gradient and simultaneously applying a gradient to said magnetic field which varies in a direction parallel to said one axis and then reversing the direction of said last-mentioned gradient and reading out the free induction signal from said object.

9 Claims, 1 Drawing Figure

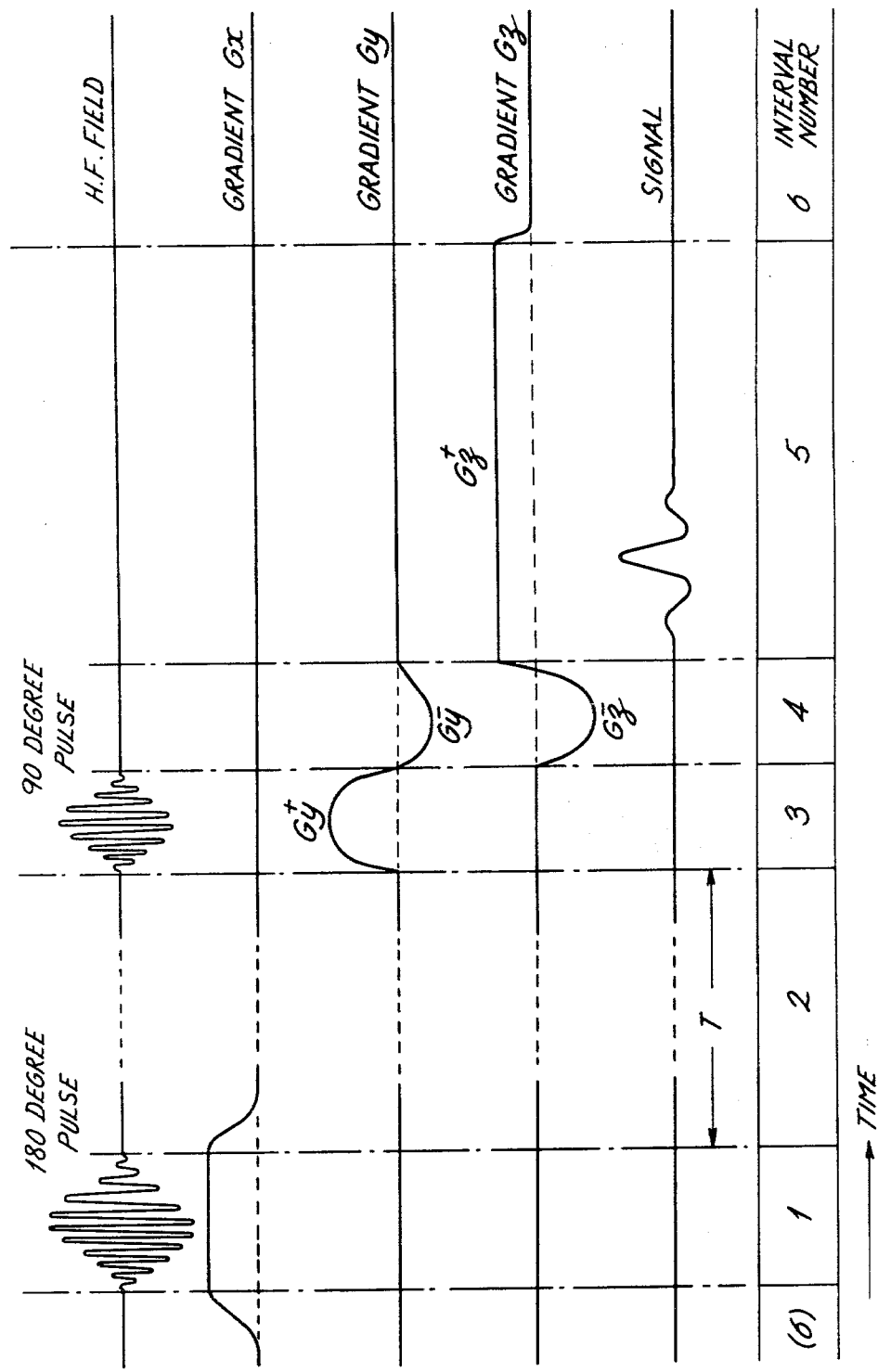

METHODS OF DERIVING IMAGE INFORMATION FROM OBJECTS

This invention relates to methods of deriving image information from objects by the use of nuclear magnetic resonance techniques.

The invention makes use of techniques involving selective excitation of parts of an object being examined.

In selective excitation three types of magnetic fields are employed in various combinations. The fields are:

1. a static uniform magnetic field which is continuously maintained along one axis, usually referenced as the Z axis.

2. a set of three orthogonal magnetic field gradients modifying the uniform magnetic field. The gradients cause the magnetic field to vary along any one or more of the X, Y or Z axes.

3. a high frequency magnetic field usually aligned in the X-Y plane. This field is applied as a short pulse and causes the atomic nuclei under investigation to change their orientation in a controlled manner. In its simplest form it is applied by means of a coil of wire would closely around the object and known as the high frequency coil.

The signals emanating from the object comprise nuclear induction signals or free precession signals and are a result of the nuclei having been disturbed by the HF pulse. They may be detected by the same coil as applies the HF pulse or a similar coil.

Two types of HF pulse may be employed known as the 90° pulse and the 180° pulse. A 90° pulse rotates the nuclei through 90° and leaves them in a state of maximum precession so that they are aligned in the X-Y plane and rotate about the Z axis. A 180° pulse is twice the size of a 90° pulse and rotates the nuclei through 180° or inverts them so that all affected nuclei point in the opposite direction.

If a single magnetic field gradient is applied together with a relatively weak HF pulse of long duration having a narrow spectrum then only nuclei whose natural resonance frequency is within this spectrum will be excited, that is to say nuclei in a location where the magnetic field is substantially equal to the static field. Thus if a magnetic field gradient Gx is applied then only nuclei lying in or close to a particular YZ plane would be excited.

According to the invention a method of deriving image formation from an object using nuclear magnetic resonance signals comprises the steps of subjecting an object to a static magnetic field along one axis, applying a first gradient to said magnetic field which varies in a direction orthogonal to said axis together with a 90° high frequency pulse, reversing the direction of said magnetic field gradient and simultaneously applying a gradient to said magnetic field which varies in a direction parallel to said one axis and then reversing the direction of said last-mentioned gradient and reading out the free induction signal from said object.

In carrying out the invention the method may include a prior step of applying a third gradient to said magnetic field which varies in a direction orthogonal both to the first gradient and to said one axis and applying a high frequency pulse to the object in the presence of said third gradient to invert nuclear spins in a selective plane therein.

In certain circumstances an interval may be included between the application of the third gradient and the first gradient to allow inverted spins to relax.

In order that the invention may be more fully understood reference will now be made to FIG. 1 of the accompanying drawing which illustrates diagrammatically a pulse sequence.

Referring now to the drawing there is shown therein a pulse sequence in which the time axis is divided into six successive intervals repeated cyclically. The fields which are applied in each of these intervals are as follows:

Interval 1

A weak 180° HF pulse is applied simultaneously with a magnetic field gradient Gx. This selectively inverts the nuclear spins in and close to the plane $X=Xo$. The value of Xo can be altered by a change in the frequency of the 180° pulse.

Interval 2

The nuclear spin system is allowed to relax by Spin-Lattice relaxation for a specified time T. No fields other than Ho are applied during this interval.

Interval 3

A weak 90° HF pulse is applied simultaneously with a magnetic field gradient $Gy^+$. This selectively excites nuclear spins in and close to the plant $Y=0$.

Interval 4

A negative magnetic field gradient, $Gy^-$ is applied to rephase the nuclear spins along the Y-direction. Simultaneously a negative magnetic field gradient, $Gz^-$ is applied to dephase the nuclear spins along the Z-direction.

Interval 5

A smaller, positive magnetic field gradient, $Gz^+$ is applied during this somewhat longer interval, termed the observation interval. During this interval, the nuclear spins rephase to form spin echo, when the free induction signal is a maximum, and then dephase. $Gz^+$ is constant during this interval, during which time the nuclear free induction signal is collected.

Interval 6

System recovery time until the occurrence of interval 1 of the next sequence. This should be long compared with the spin-lattice relaxation time T1, and is of the order of a second.

The thickness of the plane selected in each of intervals (1) and (3) is determined by the ratio of high frequency field to field gradient Gx or Gy.

Three separate free induction signals, So, S1 and S2 are obtained using this pulse sequence, for any one value of the altered high frequency in interval (1). These are: S1: The relaxation interval (2) is very small, ideally zero, but in practice limited by having to ensure that Gx is zero before the 90° pulse in interval (3) is started. S2: The relaxation interval (2) is comparable with the spin-lattice relaxation time being measured. That is, $T \approx T1$, which is a few hundred milliseconds. So: The 180° pulse and Gx pulse of interval (1) are omitted, but the rest of the sequence is identical. From these signals, two difference signals are obtained:

$$Sa = So - S1; \quad Sb = So - S2$$

Sa contains data principally on nuclear spin density and Sb data principally on spin-lattice relaxation time. Each relates to the nuclei in a thin cylinder whose axis runs in the Z-direction and is defined by the intersection of the two planes $X = X_o$ and $Y = 0$. Line images along Z are obtained by Fourier transformation of Sa and Sb, and a two-dimensional tomographic image in the X-Z plane are built up line by line by repeating this group of three pulse sequences for successive increments of $X_o$, achieved by altering the high frequency used for the 180° pulse in interval (1).

The envelope of the HF pulses may be tailored to produce a more acceptable spectral profile than would be the case with rectangular envelope pulses. It is thus possible to reduce the number of side bands in the HF pulses. The only restriction on the width of the HF pulses is that it must be entirely contained within the interval 1 or 3 allotted to it. It is also not necessary for the pulses generating the magnetic gradients to have sharply rising or falling edges.

The Gx gradient should be substantially constant for the duration of the 180° HF pulse in interval 1. This is important when line selection is obtained by altering the frequency of the 180° pulse in successive pulses. However, overlap of the Gx gradient into the intervals on either side of interval 1 (that is to say into intervals 2 and 6) is unimportant but overlap into interval 3 must be avoided.

During interval 3 the Gy gradient need not be constant but line selection is improved if Gy is held constant during the 90° HF pulse.

While the magnitude of the gradients during interval 4 are arbitrary their time integrals over this interval are important. The time integral of the Gy- gradient determines the optimum amount of rephasing along the Y direction while the time integral of the Gz- gradient determines the time of echo of the signal in interval 5. Furthermore, during interval 5 the Gx and Gy gradients must both be zero and the Gx gradient must be constant otherwise the Fourier transforms of Sa and Sb will not be line images. During the quiescent interval 6, the values of all the magnetic field gradients and in fact of the static magnetic field Ho are unimportant and this interval can conveniently be used for minor corrections to the value of Ho.

We claim:

1. A method of deriving image information from an object using nuclear magnetic resonance signals comprising the steps of subjecting an object to a static magnetic field along one axis, applying a first gradient to said magnetic field which varies in a direction orthogonal to said axis together with a 90° high frequency pulse, reversing the direction of said magnetic field gradient and applying a second gradient to said magnetic field which varies in a direction orthogonal to said first gradient and then reversing the direction of said second gradient while reading out the free induction signal from said object.

2. The method as claimed in claim 1 and including a prior step of applying a third gradient to said magnetic field which varies in a direction orthogonal both to the first and second gradients and applying a high frequency pulse to the object in the presence of said third gradient to invert nuclear spins in a selective plane therein.

3. The method as claimed in claim 2 and including an interval between the application of the third gradient and the first gradient to allow inverted spins to relax.

4. The method as claimed in claim 1 in which the said gradient to said magnetic field which varies in a direction parallel to said axis is applied simultaneously with said first gradient.

5. The method as claimed in claim 1 in which the said gradients to said magnetic field are applied so that their rising and falling edges are time varying.

6. A method of deriving image information using nuclear magnetic resonance signals from an object subjected to a static magnetic field along one axis comprising the steps of:

applying a first gradient to said magnetic field which varies in a direction orthogonal to said axis together with a 90° high frequency pulse, reversing the direction of said magnetic field gradient and applying a second gradient to said magnetic field which varies in a direction orthogonal to said first gradient and then reversing the direction of said second gradient while reading out the free induction signal from said object to obtained an So signal;

applying a third gradient to said magnetic field which varies in a direction orthogonal both to the first and second gradient and applying an inverting high frequency pulse to the object in the presence of said third gradient to invert nuclear spins in a selected plane therein, then immediately applying the first gradient to said magnetic field together with a 90° high frequency pulse, reversing the direction of said first gradient and applying the second gradient to said magnetic field and then reversing the direction of said second gradient while reading out the free induction signal from said object to obtain an S1 signal; and calculating a signal which is the difference between the So and S1 signals.

7. The method as claimed in claim 6 and including the additional steps of:

applying a third gradient to said magnetic field which varies in a direction orthogonal both to the first and second gradient and applying an inverting high frequency pulse to the object in the presence of said third gradient to invert nuclear spins in a selected plane therein, providing a delay period and then applying the first gradient to said magnetic field together with a 90° high frequency pulse, receiving the direction of said first gradient and applying the second gradient to said magnetic field and then reversing the direction of said second gradient while reading out the free induction signal from said object to obtain an S2 signal; and calculating a signal which is the difference between the So and S2 signals.

8. The method as claimed in claim 7 in which the said delay period is comparable to the average spin-lattice relaxation time of the object.

9. The method as claimed in claim 7 in which the said steps are repeated for each of a series of different frequencies of the inverting high frequency pulses whereby a series of different planes are selected from each of which So, S1 and S2 signals are obtained.

* * * * *